(12) United States Patent
Epstein et al.

(10) Patent No.: US 6,621,100 B2
(45) Date of Patent: Sep. 16, 2003

(54) POLYMER-, ORGANIC-, AND MOLECULAR-BASED SPINTRONIC DEVICES

(75) Inventors: Arthur J. Epstein, Bexley, OH (US); Vladimir N. Prigodin, Dublin, OH (US)

(73) Assignee: The Ohio State University, Columbus, OH (US)

( * ) Notice: Subject to any disclaimer, the term of this patent is extended or adjusted under 35 U.S.C. 154(b) by 37 days.

(21) Appl. No.: 10/045,543

(22) Filed: Oct. 26, 2001

(65) Prior Publication Data

US 2003/0001154 A1 Jan. 2, 2003

Related U.S. Application Data

(60) Provisional application No. 60/243,970, filed on Oct. 27, 2000.

(51) Int. Cl.[7] .............................................. H01L 51/00
(52) U.S. Cl. ..................... 257/40; 257/295; 257/422; 257/425; 257/427; 360/324.1; 360/324.2; 365/171; 365/173
(58) Field of Search .................... 257/40, 295, 421, 257/422, 425, 427; 360/324.1, 324.2, 324.11, 324.12; 365/171, 173

(56) References Cited

U.S. PATENT DOCUMENTS

| | | | | |
|---|---|---|---|---|
| 6,210,810 | B1 * | 4/2001 | Ikarashi et al. | 428/611 |
| 2002/0117727 | A1 * | 8/2002 | Engel et al. | 257/421 |
| 2002/0181171 | A1 * | 12/2002 | Chien et al. | 360/324.12 |
| 2002/0196590 | A1 * | 12/2002 | Saito et al. | 360/324.11 |

OTHER PUBLICATIONS

Prinz, G. *Magnetoelectronics*, Science 282, 1660–1663 (1998).
Araki, S. et al., *Which Spin Valve for Next Giant Magnetoresistance Head Generation?* J. Appl. Phys. 87, 5377–5382 (2000).
Monsma, D.J. et al., *Room Temperature–Operating Spin–Valve Transistors Formed by Vacuum Bonding*, Science 281, 407–409 (1998).
Fiederling, R. et al., *Injection and Detection of a Spin–Polarized Current in a Light–Emitting Diode*, Nature 402, 787–790 (1999).

(List continued on next page.)

Primary Examiner—Nathan J. Flynn
Assistant Examiner—Pershelle Greene
(74) Attorney, Agent, or Firm—Standley & Gilcrest LLP

(57) ABSTRACT

This invention relates to organic based spintronic devices, and electronic devices comprising them, including spin valves, spin tunnel junctions, spin transistors and spin light-emitting devices. New polymer-, organic- and molecular-based electronic devices in which the electron spin degree of freedom controls the electric current to enhance device performance. Polymer-, organic-, and molecular-based spintronic devices have enhanced functionality, ease of manufacture, are less costly than inorganic ones. The long spin coherence times due to the weak spin-orbit interaction of carbon and other low atomic number atoms that comprise organic materials make them ideal for exploiting the concepts of spin quantum devices. The hopping mechanism of charge transport that dominates in semiconducting polymers (vs. band transport in crystalline inorganic semiconductors) enhances spin-magneto sensitivity and reduces the expected power loss.

20 Claims, 4 Drawing Sheets

OTHER PUBLICATIONS

Ohno, Y. et al., *Electrical Spin Injection in a Ferromagnetic Semiconductor Heterostructure*, Nature 402, 790–792 (1999).

Ohno, H., *Making Nonmagnetic Semiconductors Ferromagnetic*, Science 281, 951–956 (1998).

Drury, C.J. et al., *Low-Cost All-Polymer Integrated Circuits*, Appl. Phys. Lett. 73, 108–110 (1998).

Service, R.F., *New Age Semiconductors: Pick up the Pace*, Science 287, 415–417 (2000).

Schon, J.H. et al., *Ambipolar Pentacene Field-Effect Transistors and Inverters*, Science 287, 1022–1023 (2000).

Chen, J. et al., *Large On-Off Ratios and Negative Differential Resistance in a Molecular Electronic Device*, Science 286, 1550–1551 (1999).

Collier, C.P. et al., *Electronically Configurable Molecular-Based Logic Gates*, Science 285, 391–394 (1999).

Aviram, A. et al., *Molecular Electronics: Science and Technology*, Ann. N.Y. Acad. Sci, 1998.

Reed, M.A. *Molecular-Scale Electronics*, Proc. IEEE 87, 1999.

Metzger, R.M., *Electrical Rectification by a Molecule: The Advent of Unimolecular Electronic Devices*, Acc. Chem. Res. 32, 950–957 (1999).

Kohlman, R.S. et al.,, *Insulator-Metal Transition and Inhomogeneous Metallic State in Conducting Polymers*, Handbook of Conducting Polymers, Marcel Dekker, Inc., 85–121 (1997).

Burroughes, J.H. et al., Nature 374, 529 (1990).

Wang, Y.Z. et al., *Color Variable Light-Emitted Devices Based on Conjugated Polymers*, Appl. Phys. Lett. 70, 3215–3217 (1997).

Epstein, A.J. et al., *Interface Control of Light-Emitted Devices Based on Pyridine-Containing Conjugated Polymers*, Acc. Chem Res. 32, 217–224 (1999).

Sun, R.G. et al., *1.54 µm IR PL and EL from an Er Organic Compound*, J. Appl. Phys. 87, 7589–7591 (2000).

See, for example, CDT (Cambridge Display Technology) website: www.cdtltd.co.uk.

Chitteppeddi, S. et al., *Ferromagnetism in Molecular Decamethylferrocenium Tetracyanoethenide*, Phys. Rev. Lett. 58, 2695–2998 (1987).

Pokhodnya, K.I. et al., *Low Temperature (40 C) Chemical Vapor Deposition of Thin Film of Magnets*, Adv. Mat. 12, 410–413 (2000).

Wang, Z.H. et al., *Transport and EPR Studied of Polyaniline: A Quasi-One-D Conductor with Three-Dimensional "Metallic" States*, Phys. Rev. B 45, 4190–4202 (1992).

Joo, J. et al. *Charge Transport of Mesoscopic Metallic State in Partially Crystalline Polyanilines*, Phys. Rev. B 57, 9567–9580 (1998).

Long, S.M. et al., *EPR Study of the Disorder in $V(TCNE)_x\ y(MeCN)$ High-$T_c$ Molecule-Based Magnet*, Mol. Cryst. Liq. Cryst. 272, 207–215 (1995).

Kohlman, R.S. et al., *Limits for Metallic Conductivity in Conducting Polymers*, Phys. Rev. Lett. 78, 3915–3118 (1997).

Bolton-Heaton, C.J. et al., *Distribution of Time Constanst for Tunneling through a 1D Disordered Chain*, Phys. Rev. B 60, 10569–10573 (1999).

Samukhin, A.N. et al.,, *Hopping Conductivity of a Nearly 1D Fractal: A Model for Conducting Polymers*, Phys. Rev. B 58, 11354–11370 (1998).

Yeomans, J.M., *Statistical Mechanics of Phase Transitions*, Oxford Univ. Press, N.Y., 1992.

Pu, L., *Chiral Conjugated Polymers*, Acta Polymerica 48, 116–141 (1997).

Peeters, E. et al., *Circularly Polarized EL from a Polymer LED*, J. Am. Chem. Soc. 119, 9909–9910 (1997).

Charney, E., *The Molecular Basis of Optical Activity: Optical Rotary Dispersion and Circular Dichroism*, Wiley-Interscience, Chichester, 1979.

\* cited by examiner

POLYMER-, ORGANIC-, AND MOLECULAR-BASED SPINTRONIC DEVICES

This Application claims the benefit of U.S. Provisional Application No. 60/243,970, filed Oct. 27, 2000, which is hereby incorporated by reference in its entirety.

TECHNICAL FIELD OF THE INVENTION

This invention relates to organic based spintronic devices, and electronic devices comprising them, such as spin valves (such as those shown in FIGS. 1 and 3), spin tunnel junctions, spin transistors and spin light-emitting devices that use the arrangements of the present inventions.

BACKGROUND AND SUMMARY OF THE INVENTION

1. Innovation and Concepts

New polymer-, organic- and molecular-based electronic devices in which the electron spin degree of freedom controls the electric current to enhance device performance provide a key basis for a broad range of technologies. Polymer-, organic-, and molecular-based spintronic devices have enhanced functionality, ease of manufacture, are less costly than inorganic ones. The long spin coherence times due to the weak spin-orbit interaction of carbon and other low atomic number atoms that comprise organic materials make them ideal for exploiting the concepts of spin quantum devices. The hopping mechanism of charge transport that dominates in semiconducting polymers (vs. band transport in crystalline inorganic semiconductors) enhances spin-magneto sensitivity and reduces the expected power loss.

Introduction

In the past decade there has been extensive progress in inorganic multilayer based spin valves.[1] Giant magnetic resistance and spin valves based on this effect recently enabled 100% per year growth of the areal density in the hard drive disk industry.[2] Recent extensions to magnetic semiconductor-based spin valves[3] and related spin-LEDs[4] have been shown to be promising embodiments of spintronics; however, there are substantial problems due to interfaces as well as low Curie temperatures ($T_c$) for present magnetic semiconductors.[5]

There is growing interest in replacing inorganic electronic materials with inexpensive, easier-to-fabricate polymers akin to the interest in using conducting polymers in a myriad of electronic applications.[6] Many polymer/molecular/organic materials can be dissolved in solution and spun into thin films or readily evaporated onto many substrates. This is anticipated to lead to cost efficiency and ease of manufacture in devices, especially for large area use and flexible substrates. Also, electronic polymers are known to be radiation hard. Another advantage of molecular/organic materials is the richness of chemistry which enables the synthesis of materials with very specific properties. Recently it was demonstrated[7] that organic molecules can be used to create nano-sized heterojunctions and as building blocks for a molecular computer.[8]

Today, selected polymers readily conduct electric charge.[9] The room-temperature conductivity $\sigma_{RT}$ of conjugated polymers, such as polyacetylene, polyaniline, and polypyrrole, can be controlled over 15 decades by doping and structural order and attain a value that is only an order of magnitude below the record conductivity of superpure Cu ($\sigma_{RT}=6\times10^5$ S/cm).

Since the report in 1990 of electroluminescence[10] in the light emitting polymer (LEP) PPV, there have been many advances in polymer light-emitting diodes. Polymer/molecule based LEDs in all wavelengths of light[11] (from ir to uv) and with a wide variety of output parameters are known[12] and commercialization of polymer LEDs has begun.[13]

Molecule-based magnetism started with the discovery[14] in the mid 1980's of ferromagnetism at 4.8 K in the linear chain of electron transfer salt [FeCp*$_2$][TCNE] (Cp*=pentamethylcyclopendienide; TCNE=tetracyanoethylene) by Miller and Epstein. Today there is "polymeric" material such as V[TCNE]$_x$ (x~2) that is room temperature magnet and which is processable at room temperature by using conventional organic chemistry, common solvents, and low temperature chemical vapor deposition (CVD).[15] V[TCNE]$_x$ is a 'soft' magnet with magnetic ordering temperature $T_c$=400 K, a small coercive field $H_c$=4.5 Oe (varying by more than one order of magnitude with details of preparation/processsing) at 300 K, and semiconducting conductivity $\sigma_{RT}\sim10^{-5}$ S/sm. Other examples of polymer/molcule/organgic based magnets include Prussian Blue(s). Examples of Prussian Blue(s) structure-containing compounds include V[Cr(CN)$_6$]$_x$·YH$_2$O, where x is between 0.5 and 1.5; preferably 0.8 to 1.2, and Y is between 0 and 4; preferably 1.5 and 2.8.

Approach/innovative Concepts

We propose the concept of spintronics in polymer devices as all the mandatory elements can be achieved with polymers. A key argument for exploiting polymer spintronics is the very long spin coherence time ($\tau_s$) in polymers. Analysis of EPR data yields $10^{-7}$ s for poorly conducting polymers[16] and microseconds for well-conducting samples.[17] Also, $\tau_s$ is $10^{-8}$ s for V[TCNE]$_x$,[18] which is longer than that of conventional inorganic semiconductors ~$10^{-9}$ s. Polymers enable us to overcome difficulties that inorganic spintronics faces such as poor spin injection through the interfaces, low Curie temperature, and low sensitivity. Preliminary measurements yield low barriers to charge injection between magnetic and conducting polymers. Table 1 is a comparative summary of semiconductor and polymer-based magnet parameters.

TABLE 1

Example comparison of inorganic and polymer magnetic semiconductors parameters

|  | Semiconductor Magnets | Polymer-based Magnets |
|---|---|---|
| $T_C$ | 90 K | 400 K |
| $H_C$ | 40 Oe at 6 K | 4.5 Oe at 300 K |
| $\sigma_{RT}$ | $10^{-5}$ S/cm | $10^{-5}$ S/cm |
| $\Delta G/G$ of spin-valve | 0.1% at 300 K 0.3% at 77 K | 40% at 300 K (anticipated) |
| $\tau_s$ | $10^{-9}$ S | $10^{-8}$ S |
| Interfaces | Rigid | Flexible, inter-penetrating |
| Processing T | High (typically >600° C.) | Low (<40° C.) |

The schematic layout of a vertical polymer-based magneto-spin gate (spin-valve) is shown in FIG. 1. The resistance of the sandwich structure (Hard Magnet—Conductor—Soft Magnet) strongly depends on the relative orientation of the magnetization of hard and soft magnets. The hard magnet aligns spins of electrons injected from the metal contact. The transit time for electrons across the central conductor is shorter than the spin coherence time;

therefore, if the magnetization of the soft magnet is aligned with that of the hard magnet, electrons easily continue their path to reach another electrode. For opposite magnetization of the soft magnet, transit of the polarized electrons is forbidden unless the spins reorient. The conducting layer in the center serves as a spacer to separate soft and hard magnets, thus, enabling the soft magnet to be tunable by an external magnetic field.

Estimates of the parameters and characteristics of a polymer spin-valve vary depending on mechanism of charge transport. In highly conducting polymers ($\sigma_{RT} \leq 100$ S/cm) the room-temperature conductivity is provided by metallic band-like motion, with charge hopping over nearest neighbor states.[19] Then the hopping rate $\omega_h$ is given by the typical phonon frequency $10^{12}$ s$^{-1}$ and the length of hopping $L_{hop}$ is the localization radius $\xi$, which is given by scale of inhomogenieties, typically 2 nm. Taking the spin coherence time $\tau_s$ as $10^{-7}$ s we find that the electron makes $N_h \sim 10^5$ hops before the electron loses its spin orientation. Hence, the spin coherence length can be estimated as $L_{coherence} \approx L_{hop} \times \sqrt{N_h} \sim 1$ μm.

If the poorly conducting polymers ($\sigma_{RT} \leq 10^{-1}$ S/cm) are used, the Mott variable range hopping (VRH) mechanism of transport dominates. In this case the hopping rate is essentially decreased, but simultaneously the length of hopping increases; therefore, on the whole the coherence length $L_{coherence}$ remains at the micron scale at least for room temperature. It is important to have $L_{coherence}$ large, as this parameter controls the effectiveness of the device and the spin coherence length also limits the allowed thickness of conducting layer $L_C < L_{coherence}$. For a hard magnet, a metallic ferromagnetic or ferrimagnetic or similar film may be used. In soft polymeric magnets, such as V[TCNE]$_x$, charge motion is by hopping and the hopping distance is determined by the disorder. We estimate the hopping length as 10 nm. The thickness of the soft magnet $L_S$ should be at least a few hopping distances, i.e., $L_S \gg 10$ nm. Other polymer, organic or molecule based magnets may be used, including those with spins in organic groups only, those with spins on metals and on organics, and those with spins only on inorganic groups connect through spinless organic groups. It is noted that nearly fully spin polarized transport may be achieved by use of ferrimagnetic order between to groups of different ionization energy. For example, for V[TCNE]$_x$, the spin ³⁄₂ of the V is opposite to the spin ½ of the TCNE. This leads to the charge carriers (coming from the TCNE) being polarized (up to 100% polarized if x=2). To read a magnetic memory, the external field for the soft magnet should be a few Gauss. V[TCNE]$_x$ with coercive force 4.5 Oe is close to this requirement.

We estimate the potential sensitivity of polymer spin-valves as follows. Through changing the magnetic polarization of the soft magnet from parallel to antiparallel with respect to the hard magnet, the activation energy for electrons in the soft magnet area increases. Therefore, the change of conductance $\Delta G$ with polarization is given by $\Delta G/G = (1 - \exp[-\Delta E/(k_B T)])$, where G is the conductance of the device. We assume that G is determined by the soft magnetic layer which is the most resistive part of sandwich. $\Delta E$ is the activation energy, which is given by the internal field $H_i$ of the soft magnet: $\Delta E = g \mu_B H_i$. According to mean field theory, $H_i$ is temperature dependent[20], and, therefore, $\Delta E = k_B T_c (1 - T/T_c)^{1/2}$, where $T_c$ is the temperature of magnetic ordering. For $T_c = 400$ K and $T = 300$ K we obtain $\Delta G/G = 40\%$. The above estimate gives an approximate scale for sensitivity, neglecting the thickness of soft magnetic film and the energy disorder by considering it as a monolayer with one hopping energy. FIG. 2 presents promising initial bulk magnetoresistance for CVD-prepared V[TCNE]$_x$ film, recording an ~0.3% change in resistance at room temperature for an applied field of 6 kOe.

For magnetic memory applications, e.g., read heads and magnetic random access memories, the current in plane (CIP) spin-valve construction, FIG. 3, is common. Here we replace the hard magnet layer with a polymer, molecule or organic based soft magnet polarized by the hard magnet. The central conducting spacer will be thin so that the total conductance principally is determined by transport through the soft magnet area. As $\sigma_{RT}$ for V[TCNE]$_x$ is ~10$^{-5}$ S/cm, less conducting polymers with VRH conductivity will be used. Again as σ in polymeric magnets is dominated by the activated hopping we expect the spin-magneto sensitivity to be very high and, perhaps, it can approach its maximum, $\Delta G/G = 50\%$. The small absolute G guarantees low power loss of device. For the polymer, organic or molecular based spin valve the nonmagnetic conductor may be an inorganic conductor or semiconductor such as copper or silicon, or an organic, molecular or polymer based conductor such as doped polythiophene or doped polyaniline, or semiconductor, such as undoped polythiophene, polyaniline, or tetracene.

Novel Polymer Spin LED

The schematic construction of an all-polymer Spin-LED, FIG. 4, has all central working elements made from polymers. Typically transparent indium-tin oxide (ITO) with high work function is used as a hole-injecting electrode. Al can be chosen to serve as the cathode as its work function is small. The electron affinity of V[TCNE]$_x$ is expected to be close to the Fermi level of Al. Spins of electrons injected from the Al contact are aligned by the strong internal field of the polymer magnet. The orientation of the internal magnetic field follows the weak applied external field. The choice of light-emitting polymer (LEP) is determined by the desired wavelength of light and need for chirality and spin orbit coupling to achieve circularly polarized emission. Examples of spin LED emitters include rare earth metal containing polymers and metal complexes. For examples, Er containing molecules (for ir emission at 1.5 microns, important for fiber optic communications), green emitting Ir and Pt containing complexes for Addition of rare earth ions with their large spin-orbit coupling will increase the circularly polarized emission and quantum yield of electroluminescence. Chiral groups and dopants as as phosphorescent dyes may also be used for achieving circularly polarized emission. The prevailing spins in LEP can be detected by increase in one of the circularly polarized components similar to magnetic circular dichroism.[22] Thus the weak external magnetic field leveraged by the soft magnet and transferred by electrons into the optically active part finally controls dichroism in the device. While $T_c > 300$ K for the magnets is routinely achievable, the interfaces between magnetic polymers and other materials is important. Coating of the films with, for example, inert polymers enhances the longevity of films and devices by making them more stable to ambient conditions. This includes greater chemical stability to air, water, and solvents, as well as abrasion resistance.

Improved performance of next generation systems requires enhanced magnetic polymers. Other organic, polymer, and molecule based thin-film magnets are based on other acceptors instead of TCNE. For example, V[TCNQ]$_x$ (TCNQ=7,7,8,8-tetracyano-p-quinodimethane) forms thin film magnets and has different magnetic behaviors. Likewise, improved materials are expected from optimization of the vanadium source for the V[TCNE]$_x$ magnetic films. Studies in this area should also lead to new classes of thin-film room-temperature magnets, e.g., V[Cr(CN)$_6$]$_x$ electrochemically prepared.

Accordingly, the present invention includes spin valves (such as those shown in FIGS. 1 and 3), spin tunnel junctions, spin transistors and spin light-emitting devices that use the arrangements of the present inventions.

REFERENCES

Figure 1:
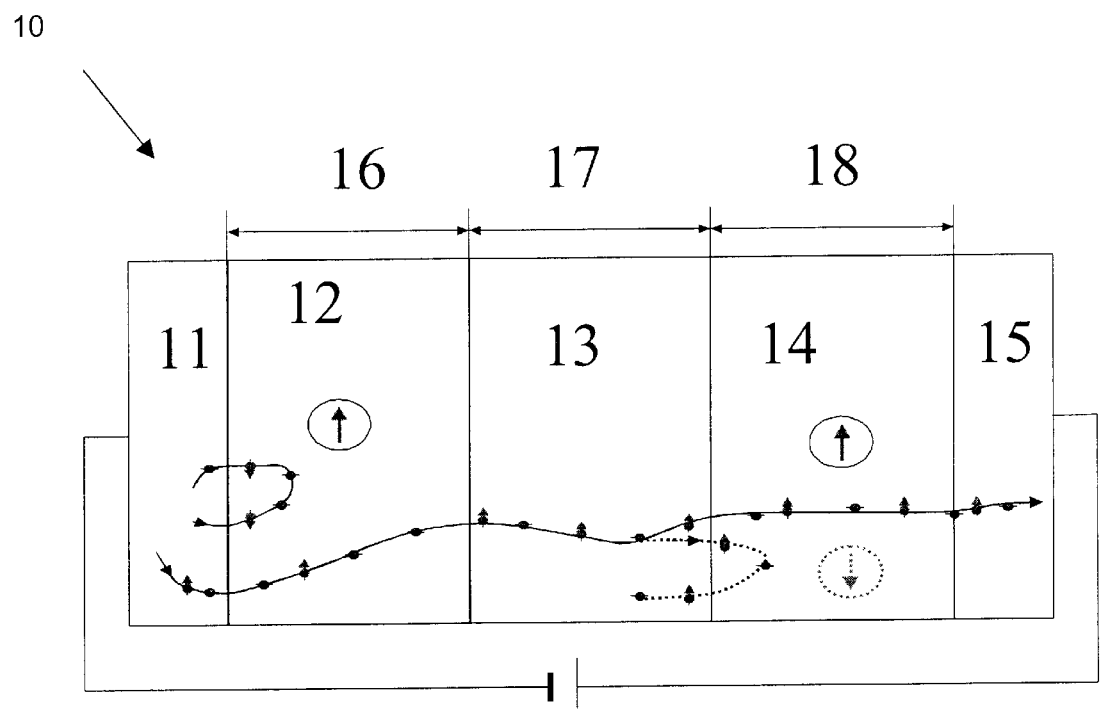
FIG. 1 shows the layout of a polymer-based spin-valve of the present invention.
Figure 2:
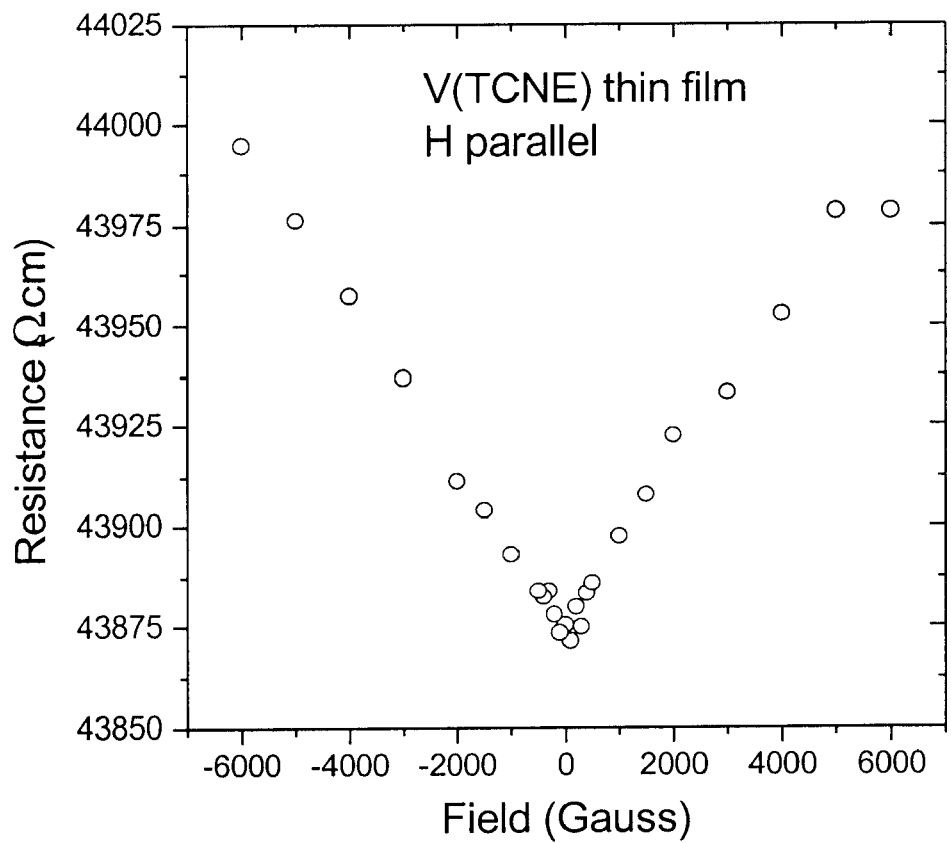
FIG. 2 is a diagram of room temperature magnetoresistance for V[TCNE]$_x$.
Figure 3:
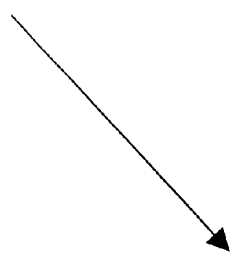
FIG. 3 is a diagram of a CIP spin-valve.
Figure 3:
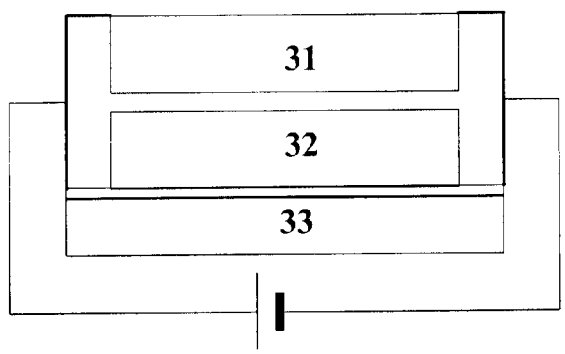
Figure 4:
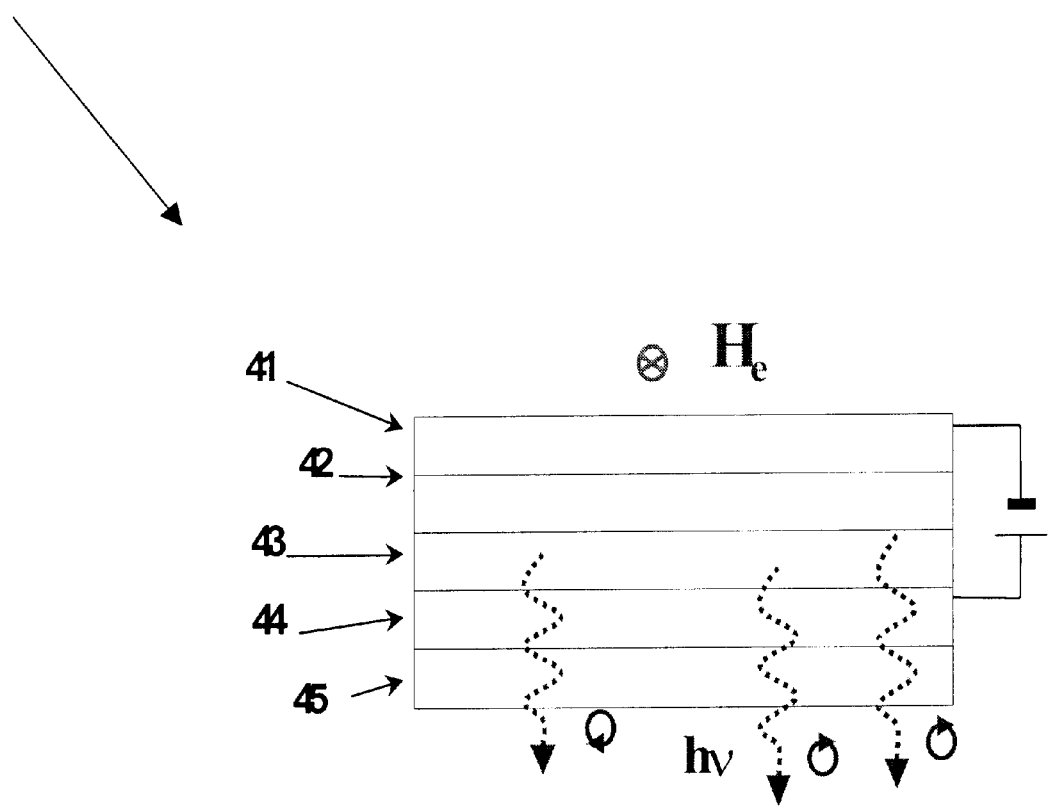
FIG. 4 shows the structure of all polymer Spin-LED emitting circularly polarized light modulated by external magnetic field.

1. G. Prinz, *Magnetoelectronics*, Science 282, 1660–1663 (1998).
2. S. Araki, et al., *Which Spin Valve for Next Giant Magnetoresistance Head Generation?* J. Appl. Phys. 87, 5377–5382 (2000).
3. D. J. Monsma, et al., *Room Temperature-Operating Spin-Valve Transistors Formed by Vacuum Bonding*, Science 281, 407–409 (1998).
4. R. Fiederling, et al., *Injection and Detection of a Spin-Polarized Current in a Light-Emitting Diode*, Nature 402, 787–790 (1999); Y. Ohno, et al., *Electrical Spin Injection in a Ferromagnetic Semiconductor Heterostructure*, Nature 402, 790–792 (1999).
5. H. Ohno, *Making Nonmagnetic Semiconductors Ferromagnetic*, Science 281, 951–956 (1998).
6. C. J. Drury, et al., *Low-Cost All-Polymer Integrated Circuits*, Appl. Phys. Lett. 73, 108–110 (1998); R. F. Service, *New Age Semiconductors: Pick up the Pace*, Science 287, 415–417 (2000); J. H. Schon, et al., *Ambipolar Pentacene Field-Effect Transistors and Inverters*, Science 287, 1022–1023 (2000).
7. J. Chen, et al., *Large On-Off Ratios and Negative Differential Resistance in a Molecular Electronic Device*, Science 286, 1550–1551 (1999); C. P. Collier, et al., *Electronically Configurable Molecular-Based Logic Gates*, Science 285, 391–394 (1999).
8. A. Aviram and M. A. Ratner, *Molecular Electronics: Science and Technology*, Ann. N. Y. Acad. of Sci, 1998; M. A. Reed, *Molecular-Scale Electronics*, Proc. IEEE 87, 1999; R. M. Metzger, *Electrical Rectification by a Molecule: The Advent of Unimolecular Electronic Devices*, Acc. Chem. Res. 32, 950–957 (1999).
9. R. S. Kohlman and A. J. Epstein, *Insulator-Metal Transition and Inhomogeneous Metallic State in Conducting Polymers*, Handbook of Conducting Polymers, Marcel Dekker, Inc., 85–121 (1997).
10. J. H. Burroghes, et al., Nature 374, 529 (1990).
11. Y. Z. Wang, A. J. Epstein, et al., *Color Variable Light-Emitted Devices Based on Conjugated Polymers*, Appl. Phys. Left. 70, 3215–3217 (1997).
12. A. J. Epstein and Y. Z. Wang, *Interface Control of Light-Emitted Devices Based on Pyridine-Containing Conjugated Polymers*, Acc. Chem Res. 32, 217–224 (1999); R. G. Sun, A. J. Epstein, et al., *1.54 µm IR PL and EL from an Er Organic Compound*, J. Appl. Phys. 87, 7589–7591 (2000).
13. See, for example, CDT website: www.cdtltd.co.uk.
14. S. Chitteppeddi, K. R. Cromack, J. S. Miller, and A. J. Epstein, *Ferromagnetism in Molecular Decamethylferrocenium Tetracyanoethenide*, Phys. Rev. Left. 58, 2695–2998 (1987).
15. K. I. Pokhodnya, A. J. Epstein, and J. S. Miller, *Low Temperature (4 C.) Chemical Vapor Deposition of Thin Film of Magnets*, Adv. Mat. 12, 410–413 (2000).
16. Z. H. Wang, A. J. Epstein, et al., *Transport and EPR Studied of Polyaniline: A Quasi-One-D Conductor with Three-Dimensional "Metallic" States*, Phys. Rev. B 45, 4190–4202 (1992).
17. J. Joo, A. J. Epstein, et al. *Charge Transport of Mesoscopic Metallic State in Partially Crystalline Polyanilines*, Phys. Rev. B 57, 9567–9580 (1998).
18. S. M. Long, P Zhou, J. S. Miller, and A. J. Epstein, *EPR Study of the Disorder in V(TCNE)$_x$y(MeCN) High-T$_c$ Molecule-Based Magnet*, Mol. Cryst. Liq. Cryst. 272, 207–215 (1995).
19. R. S. Kohiman, A. J. Epstein, et al., *Limits for Metallic Conductivity in Conducting Polymers*, Phys. Rev. Left. 78, 3915–3118 (1997); C. J. Bolton-Heaton, V. N. Prigodin and A. J. Epstein, et al., *Distribution of Time Constanst for Tunneling through a 1D Disordered Chain*, Phys. Rev. B 60, 10569–10573 (1999); A. N. Samukhin, V. N. Prigodin, L. Jastrabik, and A. J. Epstein, *Hopping Conductivity of a Nearly 1D Fractal: A Model for Conducting Polymers*, Phys. Rev. B 58, 11354–11370 (1998).
20. J. M. Yeomans, *Statistical Mechanics of Phase Transitions*, Oxford Univ. Press, N.Y., 1992.
21. L. Pu, *Chiral Conjugated Polymers*, Acta Polymerica 48, 116–141 (1997); E. Peters, et al., *Circularly Polarized EL from a Polymer LED*, J. Am. Chem. Soc. 119, 9909–9910 (1997).
22. E. Charney, *The Molecular Basis of Optical Activity: Optical Rotary Dispersion and Circular Dichroism*, Wiley-Interscience, Chichester, 1979.

The foregoing references are hereby incorporated herein by reference.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

What is claimed is:

1. A spintronic device comprising:
   (1) a first electrical contact;
   (2) a first magnetic component in contact with said first electrical contact and having a first coercive field associated therewith;
   (3) a non-magnetic conductive, semi-conductive, or insulating component in contact with said hard magnetic component; and
   (4) a second magnetic component in contact with said non-magnetic conductive, semi-conductive, or insulating component, and having coercive field less than said first coercive field; and (5) a second electrical contact in contact with said polymeric, molecular or organic-based magnetic component;

wherein at least one of said first and second magnetic components is a polymeric, molecular or organic-based magnetic component.

2. The spintronic device according to claim 1 wherein said non-magnetic conductor or semi-conductor is selected from the group consisting of conductive polymers.

3. The spintronic device according to claim 2 wherein said conductive polymer is selected from the group consisting of doped or undoped polyanilines, polythiophene, polypyrroles, Polyphenylenevinylenes and polyparaphenylenes and derivatives and mixtures thereof.

4. The spintronic device according to claim 1 wherein said non-magnetic conductor or semi-conductor is selected from the group consisting of organic or molecular electrically conductive complexes.

5. The spintronic device according to claim 4 wherein said organic or molecular electrically conductive complexes are selected from the group consisting of doped or undoped oligomers, and charge transfer salts.

6. The spintronic device according to claim 5 wherein said doped oligomers are selected from the group consisting of doped tetraaniline and doped 6-thiophene, and oligomers thereof.

7. The spintronic device according to claim 1 wherein said non-magnetic conductor or semi-conductor is selected from the group consisting of doped polyaniline, doped polythiophene or organic or molecular electrically conductive complexes selected from the group consisting of charge transfer salts.

8. The spintronic device according to claim 7 wherein said charge transfer salts are selected from the group consisting of salts and alkali metal salts of tetracyanoquinodimethne [TCNQ], salts of tetrathiofulvalene [TTF] with halide counter ions, TTF-TCNQ, salts of perylene and derivatized and benzene ring-extended structures thereof, and those with repeating perylene units, and derivatives thereof wherein the counter ions include $PF_6$, $BF_4$, $ClO_4$ and halides.

9. The spintronic device according to claim 1 wherein said non-magnetic insulating component is selected from the group consisting of insulating polymers.

10. The spintronic device according to claim 9 wherein said insulating polymer is selected from the group consisting of polymethylmethacrylates, polyethylenes, polytetrafluoroethylenes, polyvinyl carbazoles, polydiphenylacetylenes, and derivatives and mixtures thereof.

11. The spintronic device according to claim 1 wherein said non-magnetic insulating component is selected from the group consisting of molecular insulators.

12. The spintronic device according to claim 11 wherein said molecular insulator is selected from the group consisting of acene oligomers, naphthacene, anthacene, tetracene, pentacene, sexi-acene, hepta-acene, perylene, oligomers of stilbene, oligomers of phenylene, TTF and TCNQ, and oligomers of thiophene.

13. The spintronic device according to claim 1 wherein said non-magnetic conductor or semi-conductor is selected from the group consisting of elemental binary or alloy inorganic metals.

14. The spintronic device according to claim 13 wherein said elemental binary or alloy inorganic metals are selected from the group consisting of copper, silver, gold, lead, lithium, aluminum and lithium:aluminum alloys.

15. The spintronic device according to claim 1 wherein said non-magnetic semi-conductor is selected from the group consisting of silicon, germanium, GaAs, GaN, and the p- and n-doped forms thereof.

16. The spintronic device according to claim 1 wherein said non-magnetic insulator is selected from the group consisting of aluminum oxide and titanium dioxide.

17. The spintronic device according to claim 1 wherein said polymeric, molecular or organic-based magnetic component is selected from the group consisting of $M[TCNE]_x$ where TCNE is tetracyanoethylene and x is 1 to 2.5; preferably 1.8 to 2.2; and wherein M is selected from the group consisting of Mn, V, and Fe; and Prussian Blue(s) structure-containing compounds.

18. The spintronic device according to claim 1 wherein said polymeric, molecular or organic-based magnetic component is selected from the group consisting of $M[TCNQ]_x$ where TCNQ is tetracyanoquinodimethane and x is 1 to 2.5; preferably 1.8 to 2.2; and wherein M is selected from the group consisting of Mn, V, and Fe; and Prussian Blue(s) structure-containing compounds.

19. The spintronic device according to claim 1 wherein said hard magnetic component is selected from the group consisting of AlNiCo magnets, ferrous magnets, nickel-based magnets and cobalt-based magnets.

20. The spintronic device according to claim 1 additionally comprising a source of a switchable magnetic field adapted to vary the direction of magnetization of said second magnetic component, so as to alter the ability of said device to carry current.

* * * * *

UNITED STATES PATENT AND TRADEMARK OFFICE
CERTIFICATE OF CORRECTION

PATENT NO. : 6,621,100 B2
DATED : September 16, 2003
INVENTOR(S) : Arthur J. Epstein et al.

It is certified that error appears in the above-identified patent and that said Letters Patent is hereby corrected as shown below:

Column 3,
Line 11, please delete the symbol "$\leq$" and replace it with the symbol -- $\geq$ --.

Column 6,
Line 7, please delete "(4 C.)" and replace it with -- (40 C) --.
Line 19, please delete the name "Kohiman" and replace it with the name
-- Kohlman --.

Signed and Sealed this

Seventeenth Day of February, 2004

JON W. DUDAS
*Acting Director of the United States Patent and Trademark Office*